United States Patent
Sannomiya

(10) Patent No.: US 7,971,116 B2
(45) Date of Patent: Jun. 28, 2011

(54) SEMICONDUCTOR STORAGE DEVICE AND TEST METHOD THEREFOR

(75) Inventor: Takayoshi Sannomiya, Kawasaki (JP)

(73) Assignee: Renesas Electronics Corporation, Kanagawa (JP)

( * ) Notice: Subject to any disclaimer, the term of this patent is extended or adjusted under 35 U.S.C. 154(b) by 385 days.

(21) Appl. No.: 12/174,656

(22) Filed: Jul. 17, 2008

(65) Prior Publication Data

US 2009/0022000 A1    Jan. 22, 2009

(30) Foreign Application Priority Data

Jul. 17, 2007    (JP) ................................. 2007-185973

(51) Int. Cl.
*G01R 31/28*    (2006.01)
(52) U.S. Cl. ...................................... 714/733; 714/719
(58) Field of Classification Search ................. 257/368; 714/726, 729, 733, 718, 719
See application file for complete search history.

(56) References Cited

U.S. PATENT DOCUMENTS

| 6,779,144 | B2 * | 8/2004 | Hayashi et al. ............... 714/731 |
| 2002/0167055 | A1 * | 11/2002 | Iwasaki ......................... 257/368 |
| 2004/0107396 | A1 * | 6/2004 | Barone et al. ................. 714/733 |
| 2005/0193293 | A1 * | 9/2005 | Shikata ......................... 714/718 |

FOREIGN PATENT DOCUMENTS

| JP | 2005-004822 | 1/2005 |
| KR | 2000-0004654 | 3/2000 |

OTHER PUBLICATIONS

Korean Patent Office issued a Korean Office Action, Application No. 520020416681, Oct. 27, 2009.

* cited by examiner

*Primary Examiner* — David Ton
(74) *Attorney, Agent, or Firm* — Young & Thompson

(57) ABSTRACT

Disclosed is a semiconductor device including a BIST provided with a plurality of scan FFs (flip-flops), a data address signal generation circuit unit which respectively generates a data signal and an address signal based on a set value of a scan FF, WEB generation circuit unit which generates a signal WEB which controls writing to and reading data from the semiconductor memory based on an scan FF value, and a test signal control circuit unit which controls the data address signal generation circuit unit and the WEB generation circuit unit, based on a received control signal, controls selectors, and selects and controls, as data and address signals to be supplied to the memory, data signal and address signals from the data address signal generation circuit unit or data and address signals via a user defined circuit.

14 Claims, 12 Drawing Sheets

| INPUT SIGNAL | OUTPUT SIGNAL |
|---|---|
| 41-31-52 | WEB |
| 0 | SIGNAL VALUE FROM 14 |
| 1 | SIGNAL VALUE FROM SCANFF 32 |

FIG.4A

| case | INPUT SIGNAL | | | | |
|---|---|---|---|---|---|
| | RAM_MODE | BIST_MODE | RAM_REP | RAM_BIT_DI | RAM_BIT_AD |
| 1 | 0 | 0 | X | X | X |
| 2 | 0 | 1 | X | X | X |
| 3 | 1 | 0 | 1 | 0 | 0 |
| 4 | 1 | 0 | 0 | 1 | 0 |
| 5 | 1 | 0 | 0 | 0 | 1 |

FIG.4B

| Case | OUTPUT SIGNAL | | | | |
|---|---|---|---|---|---|
| | 41-31-52 | 44-9 | 45-10 | 42-56 | 43-57 |
| 1 | 0 | 0 | 0 | 0 | 0 |
| 2 | 0 | 1 | 1 | 0 | 0 |
| 3 | 1 | 0 | 0 | 0 | 0 |
| 4 | 0 | 1 | 0 | 1 | 0 |
| 5 | 0 | 0 | 1 | 0 | 1 |

FIG.6A

| case | INPUT SIGNAL | | | | |
|---|---|---|---|---|---|
| | RAM_MODE | RAM_INV | 41-31-52 | 42-56 | 43-57 |
| 1 | 0 | X | X (0) | X (0) | X (0) |
| 2 | 1 | 0 | X | 1 | 0 |
| 3 | 1 | 0 | X | 0 | 1 |
| 4 | 1 | 1 | 0 | 1 | 1 |
| 5 | 1 | 1 | 1 | 1 | 1 |

FIG.6B

| Case | OUTPUT SIGNAL | |
|---|---|---|
| | 20d-9 | 20e-10 |
| 1 | SIGNAL VALUE FROM WITHIN BIST | SIGNAL FROM WITHIN BIST |
| 2 | SIGNAL VALUE OF SCANFF 20d ITSELF | SIGNAL FROM WITHIN BIST |
| 3 | SIGNAL FROM WITHIN BIST | SIGNAL VALUE OF SCANFF 20e ITSELF |
| 4 | VALUE OBTAINED BY INVERTING SIGNAL VALUE OF SCANFF 20d ITSELF | VALUE OBTAINED BY INVERTING SIGNAL VALUE OF SCANFF 20e ITSELF |
| 5 | SIGNAL VALUE OF SCANFF 20d ITSELF | VALUE OBTAINED BY INVERTING SIGNAL VALUE OF SCANFF 20e ITSELF |

FIG.8A

|  | TEST_MODE | BIST_MODE | RAM_MODE | RAM_REP | RAM_BIT_DI | RAM_BIT_AD | RAM_INV |
|---|---|---|---|---|---|---|---|
| NORMAL OPERATION | 0 | 0 | 0 | X | X | X | X |
| BIST | 0 | 1 | 0 | X | X | X | X |
| TEST 1 | 1 | 0 | 1 | 1 | 1 | 0 | 0 |
| TEST 2(1) | 1 | 0 | 1 | 1 | 1 | 1 | 0 |
| TEST 2(2) | 1 | 0 | 1 | 1 | 1 | 1 | 1 |

FIG.8B

|  | SELECTOR | | | | | | |
|---|---|---|---|---|---|---|---|
|  | 8 | 9 | 10 | 12 | 31 | 56 | 57 |
| NORMAL OPERATIOM | 0 | 0 | 0 | 0 | 0 | 0 | 0 |
| BIST | 0 | 1 | 1 | 0 | 0 | 0 | 0 |
| TEST 1 | 1 | 1 | 0 | 0 | 1 | 1 | 0 |
| TEST 2(1) | 1 | 1 | 1 | 0 | 1 | 1 | 1 |
| TEST 2(2) | 1 | 1 | 1 | 0 | 1 | 1 | 1 |

SEMICONDUCTOR STORAGE DEVICE AND TEST METHOD THEREFOR

REFERENCE TO RELATED APPLICATION

This application is based upon and claims the benefit of the priority of Japanese patent application No. 2007-185973, filed on Jul. 17, 2007, the disclosure of which is incorporated herein in its entirety by reference thereto.

FIELD OF THE INVENTION

This invention relates to a semiconductor device, and in particular, to a semiconductor device and a test method preferable for testing a device including a RAM (Random Access Memory).

Testing of a RAM provided in a SoC (System on Chip) is generally performed using a test pattern according to an algorithm built into a BIST (Built in Self Test) circuit. The BIST performs a self-test by embedding a test pattern generator which generates a test pattern to be supplied to a circuit under test in the device, a test pattern compressor which compresses an output pattern from the circuit under test, and a comparator which compares the compressed test pattern with an expected output pattern.

With the advance of the micro-fabrication process of semiconductor devices, in testing a RAM provided in the SoC, it has With the advance of the micro-fabrication process of semiconductor devices, in testing a RAM provided in the SoC, it has become necessary to perform:

a test of writing and reading data consecutively and speedily with respect to a specific address, and a test of reading, at actual speed (actual operation speed), a data signal which has been written via a UDL (user circuit).

FIG. 12 is a diagram showing a configuration (FIG. 1 of Patent Document 1) disclosed in Patent Document 1. In FIG. 12, 911 indicates an address generator, 912 indicates a memory to be tested (memory under test), 913 indicates a data generator, 914 indicates a data comparator, 915 indicates an address change register formed of a flip-flop group, 916 indicates an exclusive OR (XOR) circuit, 917 indicates an inverted pattern setting register formed of a shift register, 918 indicates a logic inverting circuit ( inverter), 919 indicates a memory control register formed of shift registers 919a, 919b, . . . and 919n.

The address generator 911 generates a test address synchronized with a clock CLK.

The data generator 913 generates test data synchronized with a clock CLK.

The data comparator 914 performs a comparison of data from the data generator 913 and data from the memory under test 912, synchronized with the clock CLK, and outputs a decision signal (Pass/Fail).

The logic inverting circuit 918 is inserted between an output of the data generator 913 and an input of the memory under test 912, and between an output of the memory under test 912 and an input of the data comparator 914.

The inverted pattern setting register 917 supplies an LSB (Least Significant Bit) signal of a shift register which periodically shifts data, in synchronization with the clock CLK, to the logic inverting circuit 918.

The logic inverting circuit 918 operates as a non-inverting circuit when the LSB signal from the inverted pattern setting register 917 is "0", and operates as an inverting circuit when the LSB is "1".

The shift registers 919a, 919b, . . . and 919n in the memory control register 919 periodically shift data in synchronization with the clock CLK, generate a memory control signal for the memory under test 912, and supplies the so generated signal to the memory under test 912.

The exclusive OR circuit 916 performs an exclusive OR operation on an address output from the address generator 911 and data for change, output from the address change register 915, and supplies an exclusive OR operation result signal directly, as a memory address, to the memory under test 912.

By setting an arbitrary value to the address change register 915, the inverted pattern setting register 917, the logic inverting circuit 918, and the memory control register 919, it is possible to arbitrarily change data, originally generated by the address generator 911 and the data generator 913, and the memory control signal.

It is possible to inverse an arbitrary bit in an address in accordance with a bit string set in the address change register 915.

Assuming that a bit string of an address output from the address generator 911 is A1, A2, A3, . . . , Aj, . . . and An, a bit string of data for change, output from the address change register address change register 915, is F1, F2, F3, . . . , Fj, . . . and Fn, and that a bit string of an exclusive OR signal output from the exclusive OR circuit 916 is X1, X2, X3, . . . , Xj, . . . and Xn, the following relationship holds.

$X1 = XOR(A1, F1)$,
$X2 = XOR(A2, F2)$,
$X3 = XOR(A3, F3)$,
$Xj = XOR(Aj, Fj)$,
$Xn = XOR(An, Fn)$ $Xj = XOR(Aj, Fj)$, where j is greater or equal to 1 and less than or equal to n, is given as follows:

$Xj = XOR(Aj, 0) = Aj$, if $Fj = 0$.
$Xj = XOR(Aj, 1) = /Aj$, if $Fj = 1$ where "/" (slash) represents a logical inversion.

According to how a bit string $\{F1, F2, F3, \ldots, Fj, \ldots, Fn\}$ of data for change, output from the address change register 915, is set, it is possible to arbitrarily change the address $\{X1, X2, X3, \ldots, Xj, \ldots, Xn\}$ of the exclusive OR signal.

For example, if
$\{F1, F2, F3, \ldots, Fj, \ldots, Fn\} = \{0, 0, 1, \ldots 0, \ldots, 1\}$,
then
$\{X1, X2, X3, \ldots, Xj, \ldots, Xn\} = \{A1, A2, /A3, \ldots, Aj, \ldots, /An\}$
Furthermore, if
$\{F1, F2, F3, \ldots, Fj, \ldots, Fn\} = \{1, 0, 1, \ldots 1, \ldots, 0\}$
then
$\{X1, X2, X3, \ldots, Xj, \ldots, Xn\} = \{/A1, A2, /A3, \ldots, /Aj, \ldots, An\}$ The address output from the address generator 911 periodically indicates all addresses. Therefore, using the address change register 915 and the exclusive OR circuit 916, by inverting an arbitrary bit of an address from the address generator 911, it is possible to change access order of an address.

Next, the functionality of the logic inverting circuit 918 will be described.

A bit string Dx output from the data generator 913 is assumed to be as follows:
$Dx = \{D1, D2, D3, \ldots, Dn\}$ A bit string Ix output from the logic inverting circuit 918 to the memory under test 912 is assumed to be as follows:
$Ix = \{I1, I2, I3, \ldots, In\}$ Furthermore, a bit string Kx read from the memory under test 912 is assumed to be as follows:

Kx={K1, K2, K3, . . . , Kn}

A bit string Ex output from the logic inverting circuit 918 to the data comparator 914 is assumed to be as follows:

Ex={E1, E2, E3, . . . , En}

The data comparator 914 compares the read bit string Ex and the bit string Dx that has been output for writing as an expected value.

When an LSB signal of the inverted pattern setting register 917 is 0, the logic inverting circuit 918 is in a non-inverting state, and the following relation holds:

Ix=Dx, and

Ex=Kx

If the comparison result of the bit string Ex and the bit string Dx indicates Ex=Dx, then Kx=Ix. It is decided that a writing operation and a reading operation with respect to the memory under test 912 have been appropriately carried out.

On the other hand, when the LSB signal is 1, the logic inverting circuit 918 is in an inverting state, Ix=/Dx (that is, /Ix=Dx), and furthermore, Ex=/Kx={/K1, /K2, /K3, . . . , /Kn}.

If the comparison result of the bit string Ex and the bit string Dx indicates Ex=Dx then /Kx=/Ix. It is decided that a writing operation and a reading operation with respect to the memory under test 912 have been appropriately carried out.

With regard to writing of test data, by repeating inverting and non-inverting at a constant period, it is possible to write arbitrary test data adapted to each address to the memory under test 912.

The data compared in testing a memory device, as described above, is necessarily be data that has been written, and since the same inverter operation is performed in writing and reading, comparison is possible irrespective of periodic changes.

Furthermore, with regard to a control signal of the memory under test 912 also, since an arbitrary change is possible in accordance with a setting of the memory control register 919, it is possible to realize a memory control state as necessary.

[Patent Document 1]

JP Patent Kokai Publication No. JP-P2005-004822

SUMMARY OF THE DISCLOSURE

The entire disclosure of Patent Document 1 is incorporated here in by reference thereto. The following analysis is given according to the present invention.

In the configuration shown in FIG. 12, in case of data being consecutively written to and read from a specific address in RAM, it is possible to generate a specific address by the address change register 915 and the exclusive OR circuit 916.

However, in case where it is desired to fix an address to for example "00010", assuming that, synchronizing with the clock CLK, the address generator 911 generates an address signal in sequence of

"00000" "00010" "00100", a setting is necessary such that

"00010" "00000" "00110"

is output from the address change register 915.

That is, in the exclusive OR circuit 916, if values "00010", "00000", and "00110" from the address change register 915 and respective exclusive logical OR thereof are taken, with respect to the addresses "00000", "00010", and "00100" from the address generator 911, a fixed address value "00010" from output of the exclusive OR circuit 916 is supplied to the memory under test 912.

In this way, in case where a value for fixing an arbitrarily indicated address value, with regard to the address generator 911 which operates in synchronization with the clock CLK, is output from the address change register 915, as needed, to the exclusive OR circuit 916, a writing cycle of a bus (not shown in FIG. 12) connected to the address change register 915 is influenced. As a result, when fixing to an arbitrary address value is done with respect to the memory under test memory under test 912 to perform a test, it is difficult to perform a test in which data is written to and read from a specific address, consecutively and at high speed.

The invention disclosed in the present application is configured as follows.

In one aspect of the present invention, there is provided a a semiconductor device which includes: a plurality of scan flip-flops respectively set to an arbitrary value of 0 or 1 by a scan-shift operation is provided, a BIST (Built in Self Test) being serially connectable, the device having a data address signal generation circuit unit which generates a data signal based on a set value of a first scan flip-flop in the BIST, and generates an address signal based on a set value of a second scan flip-flop in the BIST, a write/read signal generation circuit unit (WEB generation circuit unit) which generates a signal (WEB signal) that controls writing to and reading from an electronically writable and readable memory, to be supplied to the memory, and a test signal control circuit unit which controls the data address signal generation circuit unit and the write/read signal generation circuit unit, based on a received control signal, and selects, as an address signal, a data signal and/or an address from the data address signal generation circuit unit.

In the present invention, there is also provided a data signal switching circuit which selects, as a data signal to be supplied to the memory, either of the data signal from the data address signal generation circuit unit and data via a user defined circuit, and an address signal switching circuit which selects, as an address signal to be supplied to the memory, an address signal from the data address signal generation circuit unit and an address signal via another user defined circuit, wherein the test signal control circuit unit respectively generates and outputs a signal that controls switching of the data signal switching circuit and a signal that controls switching of the address signal switching circuit.

In the present invention, there is provided in the BIST a third scan flip-flop which holds data read from the memory is provided, and the read data captured into the third scan flip-flop is output from a scan output terminal to the outside by a scan-shift operation.

The present invention may be configured such that the data address signal generation circuit unit is provided with a first selector circuit at which are received a data signal from in the BIST, and a signal obtained by feeding back an output signal of the first scan flip-flop, one of which is selected and output based on a selection control signal from the test signal control circuit unit, wherein the output signal of the first selector circuit is supplied to an input terminal of the first scan flip-flop, and one of an output signal of the first scan flip-flop or a signal obtained by inverting an output signal of the first scan flip-flop is received, as the feedback signal, at the first selector circuit, based on a control signal from the test signal control circuit unit.

The present invention may be configured such that the data address signal generation circuit unit is provided with a second selector circuit at which are received an address signal from in the BIST, and a signal obtained by feeding back an output signal of the second scan flip-flop, one of which is selected and output based on a selection control signal from the test signal control circuit unit, wherein the output signal of the second selector circuit is supplied to an input terminal of the second scan flip-flop, and one of an output signal of the second scan flip-flop or a signal obtained by inverting an output signal of the second scan flip-flop in the inverting circuit is received, as the feedback signal, at the second selector circuit, based on a control signal from the test signal control circuit unit.

In the present invention, the first selector circuit of the data address signal generation circuit unit may be configured such that output from a fourth scan flip-flop is received as a data signal from in the BIST.

In the present invention, the second selector circuit of the data address signal generation circuit unit may be configured such that output from a fifth scan flip-flop is received as an address signal from in the BIST.

In the present invention, the write/read signal generation circuit unit (WEB generation circuit unit) may be provided with a flip-flop which captures and holds a value obtained by inverting a current signal value in the inverting circuit, as a response to a clock signal, and a selector circuit which selects one of output of the flip-flop and a received write/read signal, based on a selection control signal from the test signal control circuit unit.

In the present invention, the write/read signal generation circuit unit (WEB generation circuit unit) may be provided with a shift register formed from a plurality of flip-flops connected in cascade, a value obtained by inverting an output signal of the shift register in the inverting circuit is received as input of the shift register, and a selector circuit is provided which selects one of an output signal of the shift register and a received write/read signal, based on a selection control signal from the test signal control circuit unit. In the present invention, in the write/read signal generation circuit unit (WEB generation circuit unit), the flip-flops may be configured from a scan flip-flop.

In another aspect of the present invention, there is provided a method, in which data and address signals are respectively generated based on a value set in a scan flip-flop in the BIST (Built in Self Test), a signal controlling writing to and reading from a data-writable-readable memory is set to a write mode and given to the memory, data and address signals generated based on a value set in the scan flip-flop is supplied to the memory, a signal controlling writing to and reading from the memory is set to a read mode and data read from the memory is captured in by a scan flip-flop, read data taken in by the scan flip-flop by a scan shift operation is output to a scan-out terminal and compared with an expected value.

In the method according to the present invention, a process may be included in which either of data and address signals generated based on a value set in the scan flip-flop or data and address signals via a user defined circuit may be selected and given to the memory.

In the method according to the present invention, a data signal or an address signal generated based on a value obtained by inverting a value set in the scan flip-flop may be given to the memory.

The meritorious effects of the present invention are summarized as follows.

According to the present invention it is possible to realize a test in which data is consecutively and rapidly written to and read from a specific address of a semiconductor memory. Furthermore, according to the present invention, a test can be realized in which a data signal written via a user defined circuit (UDL) is read at actual speed.

Still other features and advantages of the present invention will become readily apparent to those skilled in this art from the following detailed description in conjunction with the accompanying drawings wherein examples of the invention are shown and described, simply by way of illustration of the mode contemplated of carrying out this invention. As will be realized, the invention is capable of other and different examples, and its several details are capable of modifications in various obvious respects, all without departing from the invention. Accordingly, the drawing and description are to be regarded as illustrative in nature, and not as restrictive.

BRIEF DESCRIPTIONS OF THE DRAWINGS

FIG. 4 is a diagram describing operation of a test signal control circuit unit of FIG. 3;

FIG. 6 is a diagram describing operation of the data address signal generation circuit unit of FIG. 5;

FIGS. 8A and 8B are drawings showing relationships between mode setting of the circuit of FIG. 7 and selection of input signal and selector.

PREFERRED MODES OF THE INVENTION

Figure 1:
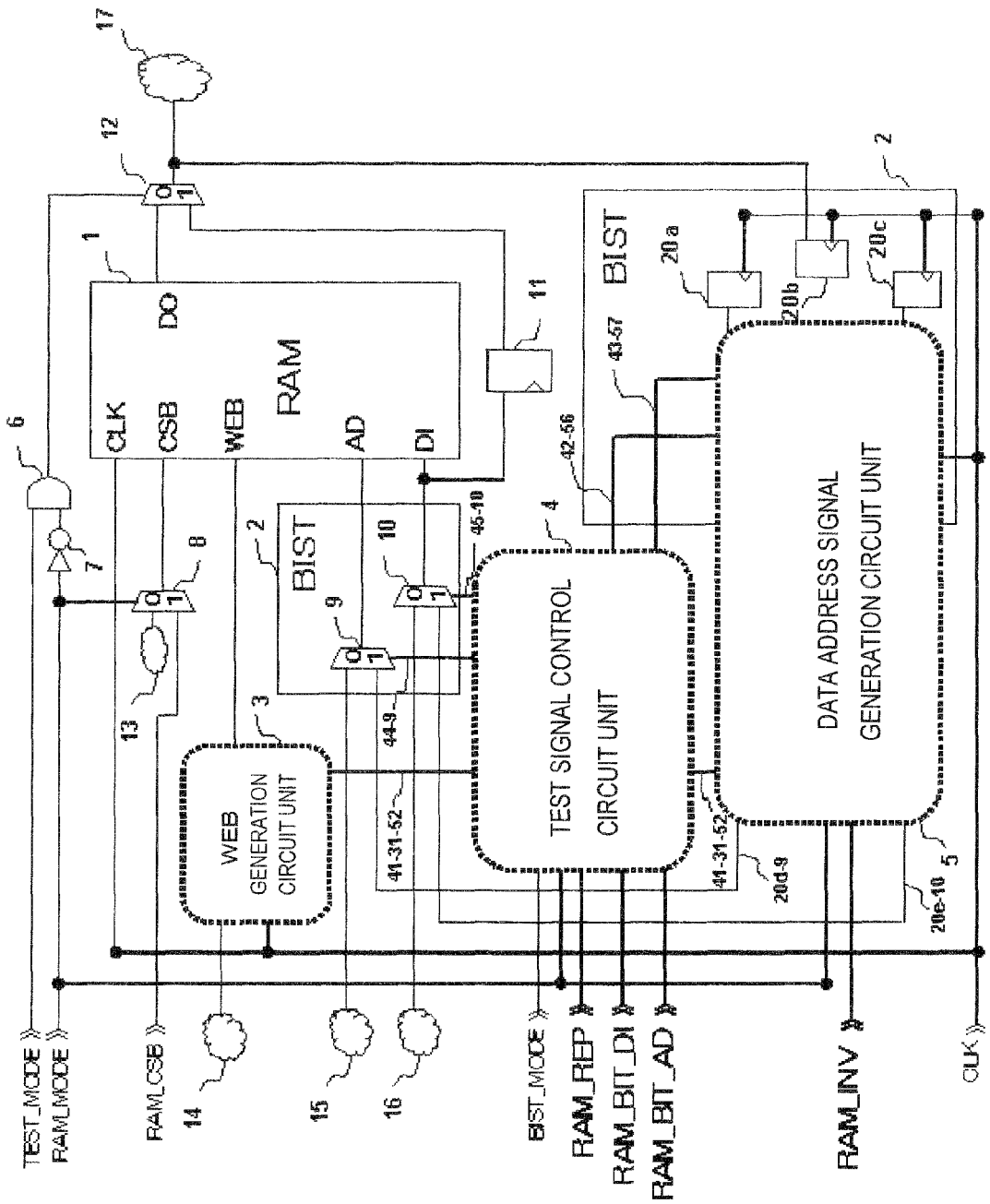
FIG. 1 is a diagram showing a configuration of one exemplary embodiment of the present invention.

In one mode of the present invention, there is provided a BIST circuit (2) includes: a plurality of scan flip-flops which are connected serially, when performing a scan test, and set to an arbitrary value of 0 or 1 by a scan-shift operation, a data address signal generation circuit unit (5) which generates data based on a set value of a scan flip-flop, and generates an address based on a set value of a scan flip-flop, a WEB generation circuit unit (3) which generates a signal (WEB signal) that controls writing to and reading from a semiconductor memory (1), and a test signal control circuit unit (4) which controls the data address signal generation circuit unit (5) and the WEB generation circuit unit (3), based on a control signal supplied thereto, and controls selectors (10, 9) which select, as data and address signals supplied to the semiconductor memory (1), one of data from the data address signal generation circuit unit (5) and data via a user defied circuit (16), and one of an address from the data address signal generation circuit unit (5) and an address signal via a user defined circuit (15). The data and address of the semiconductor memory (1) can be set to an arbitrary value, and it is possible to realize a test in which data is consecutively read from and written to a specific address at high speed.

FIG. 1 is a diagram showing a configuration of one exemplary embodiment of the present invention. In FIG. 1, to simplify descriptions, a RAM address (AD) terminal, data input (DI) terminal, and data output (DO) terminal each is drawn as one terminal.

Referring to FIG. 1, in a first exemplary embodiment of the present invention, there is provided a WEB generation circuit unit 3 which controls a WEB (Write Enable Bar) signal of the RAM 1 (write access when WEB is LOW and read access when WEB is HIGH), a data address signal generation circuit unit 5 which generates data and address signals of RAM 1, using a scan flip-flip (also termed as ScanFF) of the BIST circuit 2, a WEB generation circuit unit 3, and a test signal control circuit unit 4 which performs control of the data address signal generation circuit unit 5 and performs control whether paths of a data value and an address value supplied to the RAM 1 should be on a UDL (User Defined Logic) unit 15 and UDL 16 side, or on the data address signal generation circuit unit 5 side.

The WEB generation circuit unit 3 receives a signal from a UDL unit 14, a CLK terminal, and a signal 41-31-52 from the test signal control circuit unit 4, and has an output terminal connected to a WEB terminal of the RAM 1.

The data address signal generation circuit unit 5 has a RAM_MODE terminal, a RAM_INV terminal, the CLK terminal, and receives signals 42-56, 43-57, and 41-31-52 from the test signal control circuit unit 4.

Outputs 20d-9 and 20e-10 from the data address signal generation circuit unit 5 are respectively connected to an address signal switching circuit (selector) 9 and a data signal switching circuit (selector) 10.

The address signal switching circuit 9 and the data signal switching circuit 10 select whether an address value and a data value respectively input to the address terminal AD and the data terminal DI of the RAM 1 are supplied from the UDL 15 and the UDL 16 side, or are supplied from the data address signal generation circuit unit 5. The switching of selection in the address signal switching circuit 9 and the data signal switching circuit 10 is separately controlled by output signals 44-9 and 45-10 of the test signal control circuit unit 4. Although no particular limitation is imposed on the present invention, the address signal switching circuit 9 and the data signal switching circuit 10 are included in the BIST 2.

The test signal control circuit unit 4 receives respective signals at a RAM_MODE terminal, a RAM_REP terminal, a RAM_BIT_DI terminal, a RAM_BIT_AD terminal, and a BIST_MODE terminal. Control signals supplied to the test signal control circuit unit 4 are only shown as an example. The present invention as a matter of course is not limited to only the present configuration.

The output 41-31-52 of the test signal control circuit unit 4 is connected to the WEB generation circuit unit 3, and the data address signal generation circuit unit 5.

The outputs 44-9 and 45-10 of the test signal control circuit unit 4 are respectively connected to a selection control terminal of the address signal switching circuit (selector) 9 and a selection control terminal of the data signal switching circuit (selector) 10.

The outputs 42-56 and 43-57 of the test signal control circuit unit 4 are connected to the data address signal generation circuit Unit 5.

In the example shown in FIG. 1, a data signal output from the data signal switching circuit 10 and supplied to the data terminal DI of the RAM 1 is supplied to a flip-flop (ScanFF) 11. An output of the flip-flop 11 and an output DO of the RAM 1 are supplied to the selector 12 which provides a selected signal to the UDL unit 17. An output of a 2-input AND gate 6 receiving a TEST_MODE signal and a signal obtained by inverting a RAM_MODE signal by an inverter 7 is used as a selection control signal of a selector 12. When TEST_MODE=1 and RAM_MODE=0, the selector 12 selects output of the data signal switching circuit 10 (data to be written to the RAM 1 is output as it is, without going via the RAM 1), and in other cases the selector 12 selects output of the RAM 1. The output of the selector 12 is connected to an input terminal of the ScanFF 20b provided in the BIST 2.

Figures 2A, 2B:
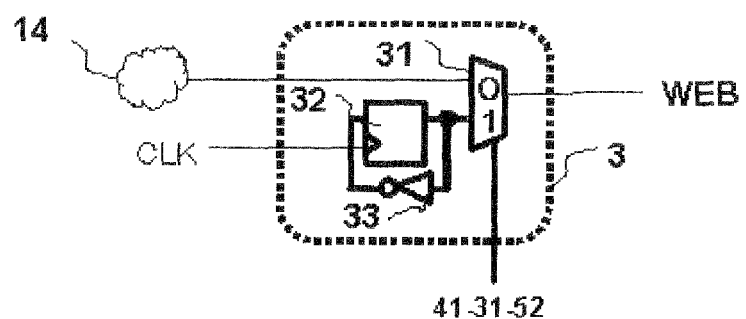
FIGS. 2A and 2B are drawings showing an example and operation of a circuit configuration of a WEB generation circuit unit of FIG. 1.

FIG. 2A is a diagram showing an example of a configuration of the WEB generation circuit unit 3 of FIG. 1. Referring to FIG. 2A, the WEB generation circuit unit 3 includes a selector circuit 31 whose output is connected to the WEB terminal of the RAM 1. The selector circuit 31 receives an output from the UDL unit 14 and an output of the ScanFF 32, and receives the output signal 41-31-52 from the test signal control circuit unit 4 as a selection control signal. The ScanFF 32 receives a clock signal CLK at a clock terminal thereof, and receives at a data input terminal thereof a signal obtained by inverting an output signal from a data output terminal of the ScanFF 32, by an inverter 33.

FIG. 2B is a diagram illustrating the operation of the WEB generation circuit unit 3. When the output signal 41-31-52 from the test signal control circuit unit 4 is 0, the selector circuit 31 selects and outputs an output signal from the UDL unit 14, and when the output signal 41-31-52 from the test signal control circuit unit 4 is 1, the selector circuit 31 selects and outputs output of the ScanFF 32.

Figure 3:
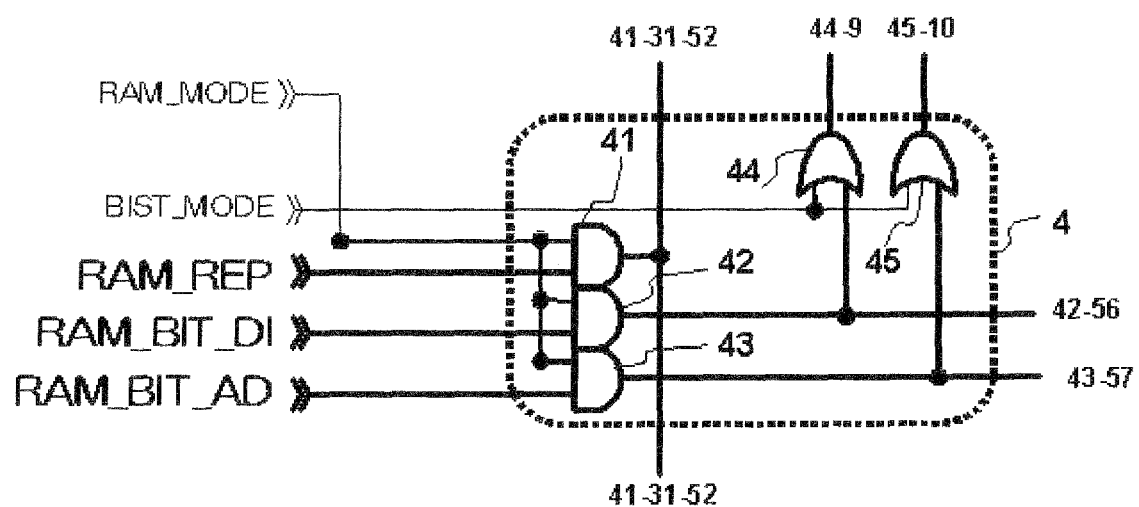
FIG. 3 is a diagram showing one example of a circuit configuration of a test signal control circuit unit of FIG. 1.

FIG. 3 is a diagram showing an example of a configuration of the test signal control circuit unit 4 of FIG. 1. Referring to FIG. 3, the test signal control circuit unit 4 includes:

a 2-input AND gate 41 having inputs connected to a RAM_MODE terminal and a RAM_REP terminal, a 2-input AND gate 42 having inputs connected to the RAM_MODE terminal and a RAM_BIT_DI terminal, a 2-input AND gate 43 having inputs connected to the RAM_MODE terminal and a RAM_BIT_AD terminal, a 2-input OR gate 44 receiving a signal of the BIST_MODE terminal and an output signal 42-56 of the AND gate 42 as input, and a 2-input OR gate 45 receiving a signal of the BIST_MODE terminal and an output signal 43-57 of the AND gate 43 as input.

The output signal 41-31-52 of the AND gate 41 is supplied to the WEB generation circuit unit 3 and the data address signal generation circuit unit 5.

The output signal 42-56 of the AND gate 42 is supplied to the data address signal generation circuit unit 5.

The output signal 43-57 of the AND gate 43 is supplied to the data address signal generation circuit unit 5.

The output signal 44-9 of the OR gate 44 is supplied as a selection control signal of the address signal switching circuit 9.

The output signal 45-10 of the OR gate 45 is supplied as a selection control signal of the data signal switching circuit 10.

FIG. 4A and FIG. 4B are diagrams illustrating the operation of the test signal control circuit unit 4 of FIG. 3.

For the input signals RAM_MODE, BIST_MODE, RAM_REP, RAM_BIT_DI, and RAM_BIT_AD of cases 1 to 5 of FIG. 4A, the output signals 41-31-52, 44-9, 45-10, 42-56, and 43-57 take values shown in FIG. 4B. In FIG. 4(A), X indicates "Don't care".

In case 1 (RAM_MODE=0, BIST_MODE=0), the output signals 44-9 and 45-10 of the OR gates 44 and 45 of the test signal control circuit unit 4 of FIG. 3 are 0. At this time, the address signal switching circuit 9 and the data signal switching circuit 10 of FIG. 1 select a signal via the UDL 15 and the UDL 16 as AD (address) and DI (data) of the RAM 1. The selector 8 selects a signal from the UDL 13 as a CSB (chip select bar) of the RAM 1.

In case 2 (RAM_MODE=0, BIST_MODE=1), the output signals 44-9 and 45-10 of the OR gates 44 and 45 of the test signal control circuit unit 4 of FIG. 3 are 1. At this time, the address signal switching circuit 9 and the data signal switching circuit 10 of FIG. 1 select signals 20$d$-9 and 20$e$-10 from the data address signal generation circuit unit 5 as AD (address) and DI (data) of the RAM 1.

In case 3 (RAM_MODE=1, RAM_REP=1), the output signal 41-31-52 of the AND gate 41 of the test signal control circuit unit 4 of FIG. 3 is 1. Receiving RAM_MODE=1, the selector 8 of FIG. 1 selects RAM_CSB as the CSB (chip select signal: active at a LOW level) of the RAM 1.

In case 4 (RAM_MODE=1, RAM_BIT_DI=1), the output signal 42-56 of the AND gate 42 of the test signal control circuit unit 4 of FIG. 3 is 1, and the output signal 44-9 of the OR gate 44 is 1. At this time, the address signal switching circuit 9 of FIG. 1 selects the address signal 20$d$-9 from the data address signal generation circuit unit 5 as AD (address) of the RAM 1, and the data signal switching circuit 10 selects a signal from the UDL 16 as DI (data) of the RAM 1.

In case 5 (RAM_MODE=1, RAM_BIT_AD=1), the output signal 43-57 of the AND gate 43 of the test signal control circuit unit 4 is 1, and the output signal 45-10 of the OR gate 45 is 1. At this time, the data signal switching circuit 10 of FIG. 1 selects the data signal 20$e$-10 from the data address signal generation circuit unit 5 as DI (address) of the RAM 1, and the address signal switching circuit 9 selects a signal from the UDL 15 as address (AD) of the RAM 1.

Figure 5:
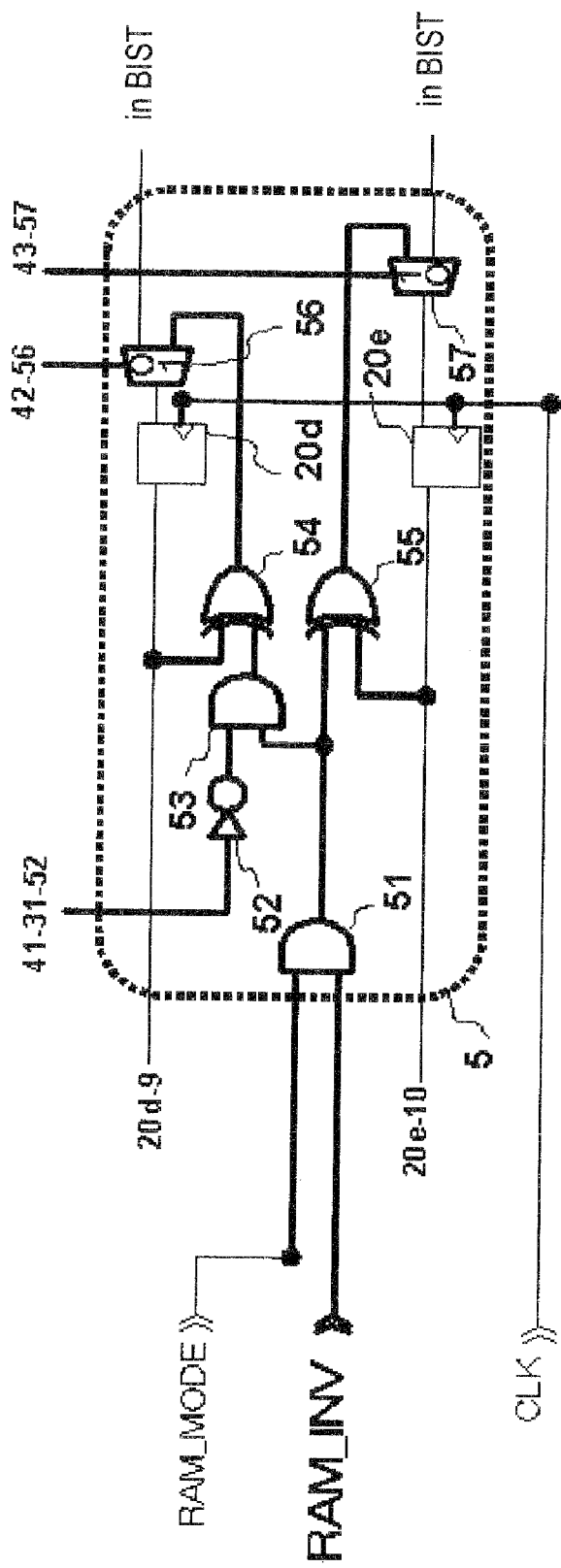
FIG. 5 is a diagram showing one example of a circuit configuration of a data address signal generation circuit unit of FIG. 1.

FIG. 5 is a diagram showing an example of a configuration of the data address signal generation circuit unit 5 of FIG. 1. Referring to FIG. 5, the data address signal generation circuit unit 5 includes:

a 2-input AND gate 51 which has inputs connected to a RAM_MODE terminal and a RAM_INV terminal, a 2-input EXOR gate 55 which receives an output signal of the AND gate 51 and the output signal 20$e$-10 of the ScanFF 20$e$ in the BIST, a selector circuit 57, which receives an output signal of the EXOR gate 55 and a signal from the ScanFF 20$a$ in the BIST (refer to FIG. 1), and selects one of the signals received, using the output signal 43-57 of the test signal control circuit unit 4 as a selection control signal, and a ScanFF 20$e$ (ScanFF in the BIST of FIG. 1) which receives an output signal of the selector circuit 57 at a data input terminal, and latches the signal at the data input terminal, responsive to the clock signal CLK. The output signal 20$e$-10 of the ScanFF 20$e$ is supplied as a data signal to a data signal switching circuit (selector) 10 of FIG. 1.

The data address signal generation circuit unit 5 further includes:

an inverter circuit 52 which receives the output signal 41-31-52 of the test signal control circuit unit 4 as input, a 2-input AND gate 53 which receives an output signal of the inverter circuit 52 and an output signal of the AND gate 51 as input, a 2-input EXOR gate 54 which receives an output signal of the AND gate 53 and the address signal 20$d$-9 as input, a selector circuit 56 which receives an output signal of the EXOR gate 54 and a signal from the ScanFF 20$c$ (refer to FIG. 1) which is a BIST-internal signal, and selects one of the signals received using he output signal 43-57 of the test signal control circuit unit 4 as a selection control signal, and a ScanFF 20$d$ (ScanFF in the BIST of FIG. 1) which receives an output signal of the selector circuit 56 at a data input terminal and latches the signal at the data input terminal responsive to the clock signal CLK. An output of the ScanFF 20$d$ is supplied to the address signal switching circuit (selector) 9 of FIG. 1 as the address signal 20$d$-9.

FIG. 6A and FIG. 6B describe operation of the data address signal generation circuit unit 5 of FIG. 5.

When signals RAM_MODE, RAM_INV, 41-31-52, 42-56, and 43-57 have values as in cases 1 to 5 of FIG. 6(A), the output signals 20$d$-9 and 20$e$-10, as in FIG. 6B, have values of a signal from in the BIST or a signal from the ScanFF (20$d$, 20$e$) or an inverted value thereof.

Figure 7:
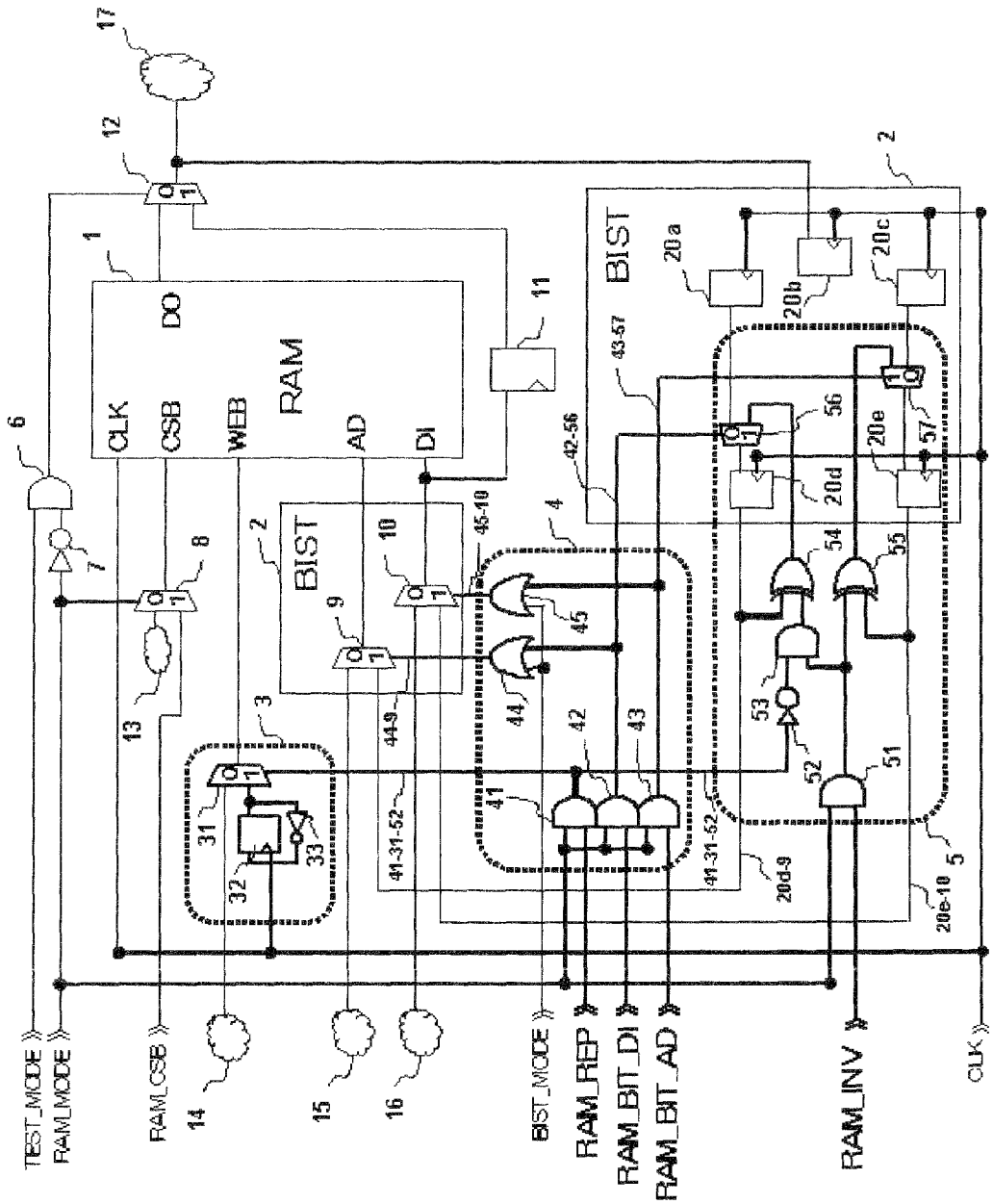
FIG. 7 is a diagram showing an example of a circuit configuration of one exemplary embodiment of the present invention.

FIG. 7 is a diagram showing the WEB generation circuit unit 3, the test signal control circuit unit 4, and the data address signal generation circuit unit 5 of FIG. 1, represented by circuit configurations of FIG. 2, FIG. 3, and FIG. 5, respectively. In FIG. 7, an address signal supplied to the address terminal AD and a data signal supplied to the data terminal DI of the RAM 1 are each represented as one line, only for simplifying descriptions. When the terminals AD and DI of the RAM 1 respectively have m bit and n bit structures (m and n are both larger than 1), a signal from the UDL 15 and a signal 20$d$-9 from the data address signal generation circuit unit 5 are both m bit parallel signals, and a signal from the UDL 16 and a signal 20$e$-10 from the data address signal generation circuit unit 5 are both n bit parallel signals. In such cases, the data address signal generation circuit unit 5 of FIG. 7 may be configured by providing m sets of circuits formed of the ScanFF 20$d$, the EXOR gate 54, and the selector 56, corresponding to the address signal m bits, and providing an inverter 52 and an AND gate 53 in common for the m sets of circuits. The ScanFF 20$a$ is also provided for the m bits. A configuration may be provided with n sets of circuits formed of the ScanFF 20$e$, EXOR gate 55, and the selector 57, corresponding to the data signal n bits, and with an AND gate 51 in common for the n sets of circuits. The ScanFF 20$c$ is also provided for the n bits.

FIG. 8A shows correspondence of operation mode and setting state of each terminal, with regard to the circuit configuration of FIG. 7. The operation mode is formed of normal operation, BIST, Test 1, Test 2 (1), and Test 2 (2). FIG. 8B shows selection of the selector circuits 8, 9, 10, 12, 31, 56, and 57 of FIG. 7, with regard to each setting of FIG. 8A. In FIG. 8B, with regard to each selector, 0 represents selection of input 0 for the selector, and 1 represents selection of input 1 for the selector.

In FIG. 8, "Test 1" is a test which performs writing and reading via a UDL at actual speed with respect to a specific address.

"Test 2 (1)" is a test (data fixed) which performs writing and reading consecutively a plurality of times with respect to a specific address.

"Test 2 (2)" is a test (data inverted) which performs writing and reading consecutively a plurality of times with respect to a specific address.

By setting the RAM_MODE terminal, a control terminal for performing a test of the RAM 1, to 0 (LOW), the WEB generation circuit unit 3, the data address signal generation circuit unit 5, and the test signal control circuit unit 4 do not operate, and operate as normal. A well known circuit may be used in configuring a Wrapper circuit (ScanFF and selector 12).

Next, test operation of the present exemplary embodiment will be described.

Figure 9:
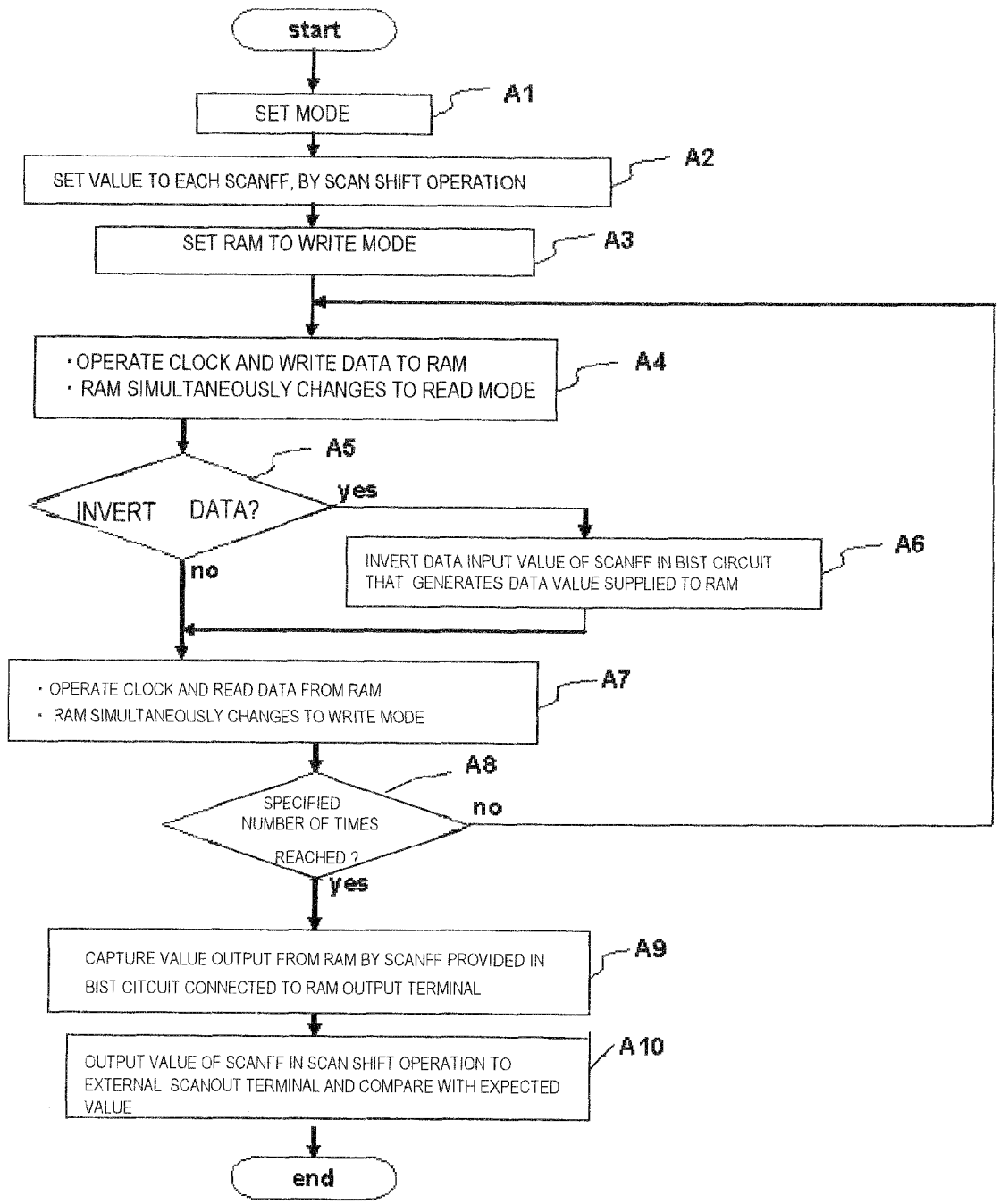
FIG. 9 is a flowchart describing one example of a test of an exemplary embodiment of the present invention.

FIG. 9 is a flow chart in which a write-read test is performed consecutively for a plurality of times with respect to a specific address. Referring to FIG. 7 and FIG. 9, a description is given concerning operation of a test which performs writing and reading consecutively for a plurality of times with respect to a specific address.

In FIG. 7, as control signals, a mode is set in which TEST_MODE=1, BIST_MODE=0, RAM_MODE=1, RAM_REP=0, RAM_BIT_DI=1, RAM_BIT_AD=1, and RAM_INV=0 (A1 in FIG. 9).

From RAM_BIT_AD=1 and RAM_MODE=1, the output signal 45-10 of the OR gate 45 is 1, and the data signal switching circuit 10 selects the output signal 20e-10 of the data address signal generation circuit unit 5.

From RAM_BIT_DI=1 and RAM_MODE=1, the output signal 44-9 of the OR gate 44 is 1, and the address signal switching circuit (selector) 9 selects the output signal 20d-9 of the data address signal generation circuit unit 5.

The selector circuit 56 connected to the ScanFF 20d in the BIST controlling an address within the data address signal generation circuit unit 5, with the output signal 42-56 of the AND gate 42 being 1, from the RAM_BIT_DI=1 and the RAM_MODE=1, selects output of the EXOR gate 54.

The selector circuit 57 connected to the ScanFF 20e in the BIST controlling data, with the output signal 43-57 of the AND gate 43 being 1, from the RAM_BIT_AD=1 and the RAM_MODE=1, selects an output signal of the EXOR gate 55.

From RAM_INV=0 an output signal of the AND gates 51 and 53 is 0, and the EXOR gate 54 outputs an output signal of the ScanFF 20d in the BIST as it is.

The EXOR gate 55 outputs an output signal of the ScanFF 20e in the BIST as it is.

Furthermore, a selector circuit 31 provided in the WEB generation circuit unit 3, with an output signal 41-41-52 of the AND gate 41 being 0, from RAM_REP=0, selects the UDL unit 14 side.

In a scan shift operation, an arbitrary value is set to each ScanFF, and a write mode value 0 is set for the ScanFF 32 provided in the WEB generation circuit unit 3 (A2 of FIG. 9).

Since an arbitrary value can be set by a scan shift operation for the ScanFF within the data address signal generation circuit unit 5 also, it is possible to set an arbitrary value for the RAM 1.

A setting of RAM_REP=1 is performed, and a ScanFF 32 side is selected for WEB control of the RAM 1. Since a write mode value of 0 is set for the ScanFF 32, the RAM 1 is set to a write mode (A3 in FIG. 9).

A clock CLK is supplied and a data input value from the data address signal generation circuit unit 5 is written to the RAM 1. At the same time, the value of the ScanFF 32 is inverted, in synchronization with a rising edge of the clock CLK, and the WEB terminal of the RAM 1 is changed to read mode value 1 (A4 in FIG. 9).

In case where a selection is made as to whether or not to invert a data signal to be supplied to the RAM 1 (A5 in FIG. 9), and inverting is performed, a change to RAM_INV=1 is made, and a value obtained by inverting a value output by the ScanFF 20e in the BIST 2 is output from the EXOR gate 55 (A6 in FIG. 9).

The EXOR gate 54 controlling an inverted value on an address side does not change from setting of the RAM_REP terminal=1 and the RAM_MODE=1.

For example, the clock CLK is made to operate at actual speed, and a value written to the RAM 1 is read from the RAM 1 at actual speed.

At the same time, the value of the ScanFF 32 is inverted, at a rising edge of the clock CLK, and an input signal of the WEB terminal of the RAM 1 is changed to write mode value 0 (A7 in FIG. 9).

In step A6, in case where a data value is inverted, an inverted value is output from the ScanFF 20e by a clock CLK.

A judgment is made as to whether writing to/reading from the RAM 1 has reached a prescribed number of times, and if the prescribed number of times has been reached, control moves to step A9. If the prescribed number of times has not been reached, steps are re-executed from step A4 (A8 in FIG. 9).

A value output from the RAM 1 is taken by the ScanFF 20b within a BIST circuit of a later stage (A9 in FIG. 9).

In a scan shift operation on a value taken into the ScanFF 20b, output is performed to an external scan-out terminal (not shown in the drawings), and a comparison is made with an expected value by a test or the like (A10 in FIG. 9).

The selector circuit 31 on a path in normal operation in which the control terminal RAM_MODE terminal is selected as 0, the address signal switching circuit 9, the data signal switching circuit 10, and the Wrapper circuit (selector) 12 are necessary in order to insert the BIST circuit 2, and no difference occurs with regard to timing and related technology.

In the present exemplary embodiment, the selector circuit 56 and the selector circuit 57 are arranged in the BIST circuit 2, but outputs of the selector circuit 56 and the selector circuit 57 are connected to the ScanFF 20d in the BIST and the ScanFF 20e in the BIST, and no difference occurs with regard to timing and related technology.

According to the present exemplary embodiment, the data signal and the address signal given to the RAM 1 are controlled by the data address signal generation circuit unit 5; the data signal can be changed at an arbitrary period, and the WEB signal carries out inversion in synchronization with the clock CLK. As a result, it is possible to perform a write-read test (a test of writing data, reading the written data, and comparing with an expected value) consecutively and speedily of data to a specific address of the RAM 1.

Figure 10:
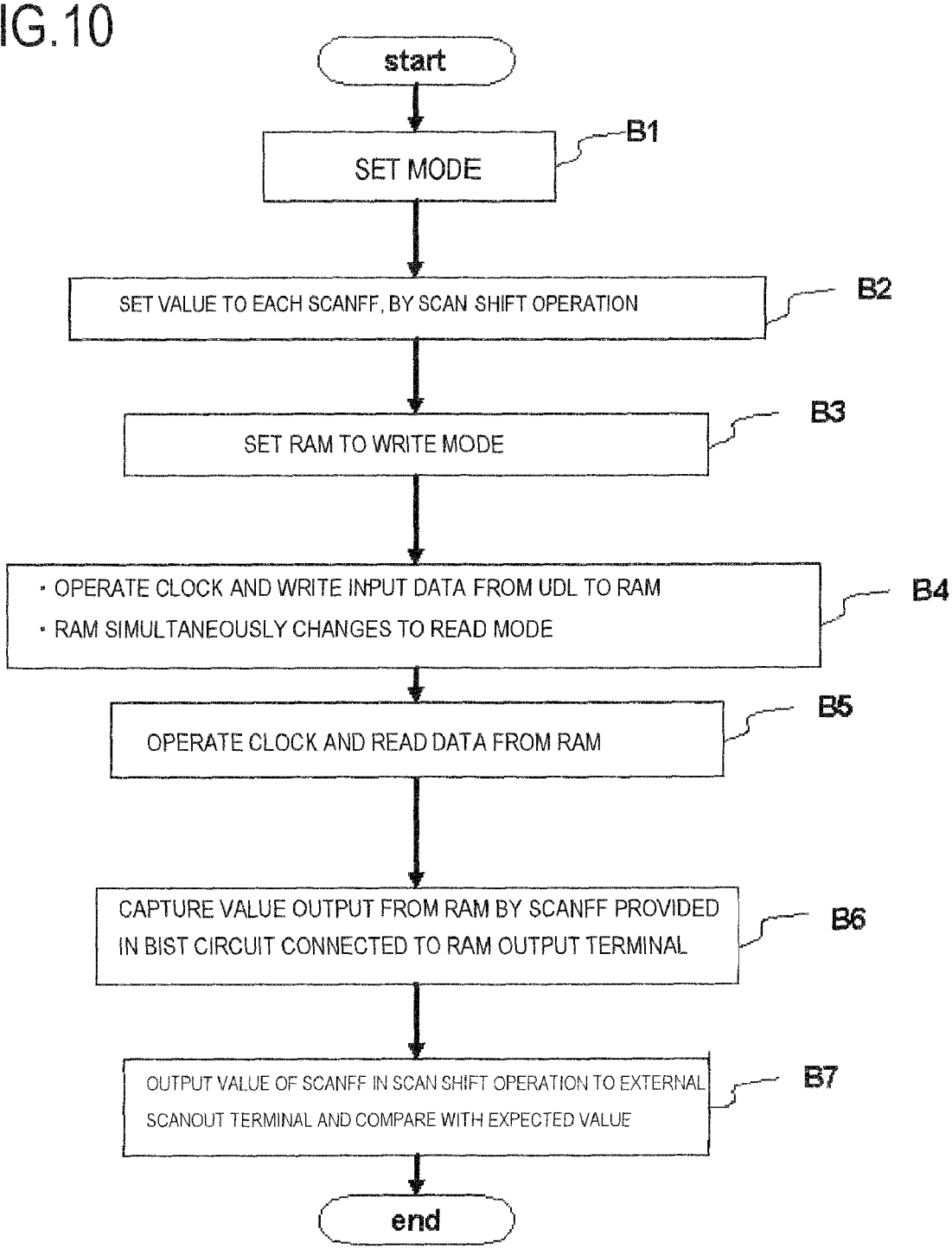
FIG. 10 is a flowchart describing another example of a test of an exemplary embodiment of the present invention.

FIG. 10 is a flowchart in which the write-read test of the RAM via a UDL at actual speed, with respect to the specific address, is performed, using the circuit configuration of FIG. 7. Referring to FIG. 7 and FIG. 10, a description will be given of operation of a test in which a data signal written via the UDL to the specific address of the RAM is read at actual speed. With regard to operation steps the same as operations described referring to FIG. 9, descriptions are omitted and points of difference are described.

A mode setting of RAM_BIT_AD=1 set at A1 of FIG. 9 is set to a mode of RAM_BIT_AD=0 (B1 of FIG. 10).

By this setting, the data signal switching circuit 10 connected to a data-line of the RAM, with a selection control signal of 0, selects the UDL unit 16 side. Other terminal settings and selection paths are the same as in step A1 of FIG. 9.

By a scan shift operation, a value is set to each ScanFF (B2 in FIG. 10), and the RAM 1 is set to a write mode (B3 in FIG. 10). That is, a clock is made to operate, and a data input value is written to the RAM 1 via the UDL unit 16. At the same time, by a clock operation, since the ScanFF 32 of FIG. 7 captures a value obtained by inverting its own value via the inverter circuit 33, the WEB of the RAM 1 has a read mode value of 1 (B4 in FIG. 10). Since the address of the RAM 1 is controlled by a ScanFF 20d in the BIST, its own value in the data address signal generation circuit unit 5 being captured, no change occurs.

Thereafter, the clock is made to operate at actual speed, and reading from the RAM 1, at the actual speed, of a value written to the RAM 1, is performed (B5 in FIG. 10).

Next, a value output from the RAM 1 is captured in the ScanFF provided in the BIST connected to an output terminal of the RAM 1 (B6 in FIG. 10). B6 corresponds to A9 of FIG. 9. A value of ScanFF is output by a scan shift operation to the external scan out terminal and is compared with an expected value (B7 in FIG. 10).

According to the present exemplary embodiment, with regard to the configuration of the first exemplary embodiment, by changing a mode setting, only a data signal of the RAM 1 selects the UDL side, an address signal of the RAM 1 selects an address signal from the data address signal generation circuit unit 5, and the WEB signal performs control by the WEB generation circuit unit 3. As a result, it is possible to perform a test of reading at actual speed a data signal written via the UDL, with respect to a specific address of the RAM 1.

Figure 11:
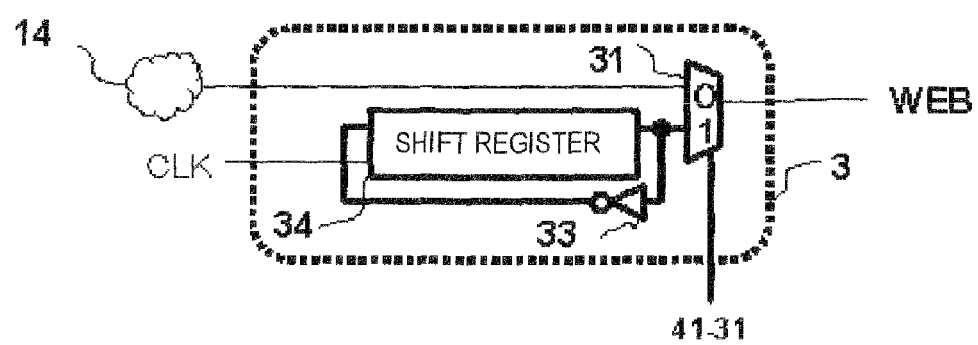
FIG. 11 is a diagram showing another example of a circuit configuration of the WEB generation circuit unit of FIG. 1.
Figure 12:
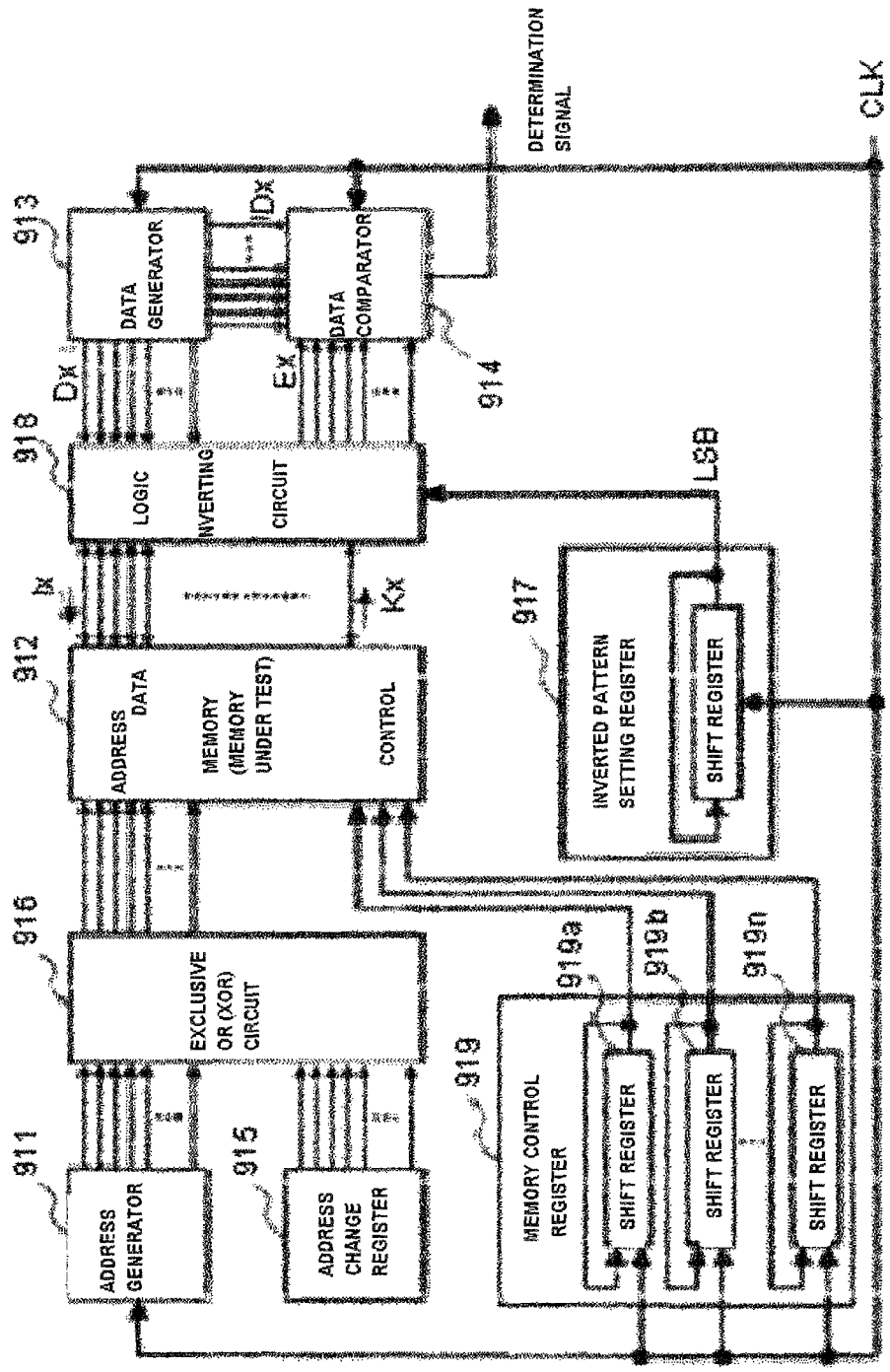
FIG. 12 is a diagram showing a configuration of Patent Document 1.

Next, a third exemplary embodiment of the present invention will be described. FIG. 11 is a diagram showing a configuration of the third exemplary embodiment of the present invention. In the present exemplary embodiment, the WEB generation circuit unit 3 is provided with a shift register 34, instead of the ScanFF 32 of the first exemplary embodiment. The shift register 34 is an n-stage shift register made up of a plurality of ScanFFs. In this case, a write-read test is possible in a range of the number of stages of the shift register.

In FIG. 11, in case where the shift register 34 is composed of for example, a 5 stage ScanFF, and "00000" is set to the shift register, a signal value controlling the WEB of the RAM 1 changes for every 5 clocks, so that writing to and reading from the RAM 1 is performed for every 5 clocks (5 consecutive cycles of writing, and 5 consecutive cycles of reading).

Furthermore, if "01010" is set, since writing to and reading from the RAM 1 is performed for every 1 clock, operation is the same as in the first exemplary embodiment.

In this way, in the present exemplary embodiment, by the WEB generation circuit unit 3 having the shift register configuration, operation of writing to and reading from the RAM 1 can be arbitrarily set in a range of the number of shift register stages.

Furthermore, in the present exemplary embodiment, by a flip-flop of the WEB generation circuit unit 3 having the shift register configuration, since it is possible to control a period of writing and reading in a range of the number of shift register stages, a test of writing to and reading from the RAM 1 can be performed at an arbitrary frequency.

As described above, in the test of the RAM, the BIST is generally used, but in this case, only a test according to a built-in BIST algorithm is possible. Furthermore, in the BIST, since testing the RAM is an object (designed for testing of RAM), it is not possible to perform a test including a vicinity of the RAM by this BIST.

According to the present exemplary embodiment, in input of the ScanFF controlling RAM data and address in the BIST, by control of the data address signal generation circuit unit, the WEB generation circuit unit in WEB control of the RAM, and the data address signal generation circuit unit and the WEB generation circuit unit, and by adding a test signal control circuit unit which controls a signal supplied to the RAM, a write-read test of data to and from a specific address consecutively and at actual speed, and a read test of a data signal written via the UDL at actual speed, are made possible, which has been unrealizable heretofore. As a result, a test according to operation of the RAM is possible to implement.

Each disclosure of Patent Document 1 as described above is incorporated here in by reference. Variations and modifications of embodiments and examples are possible within bounds of the entire disclosure (including the scope of the claims) of the present invention, and also based on fundamental technological concepts thereof. Furthermore, a wide variety of combinations and selections of various disclosed elements are possible within the scope of the claims of the present invention. That is, the present invention clearly includes every type of transformation and modification that a person skilled in the art can envisage according to technological concepts and the entire disclosure including the scope of the claims.

It should be noted that other objects, features and aspects of the present invention will become apparent in the entire disclosure and that modifications may be done without departing the gist and scope of the present invention as disclosed here in and claimed as appended herewith.

Also it should be noted that any combination of the disclosed and/or claimed elements, matters and/or items may fall under the modifications aforementioned.

What is claimed is:

1. A semiconductor device comprising:
   a BIST (Built in Self Test) that includes a plurality of scan flip-flops which are able to be serially connected and are respectively set to any value of 0 and 1 by a scan-shift operation;
   a data address signal generation circuit unit that generates a data signal based on a set value of a first scan flip-flop in said BIST, and that generates an address signal based on a set value of a second scan flip-flop in said BIST;
   a write/read signal generation circuit unit that generates a signal controlling writing to and reading from an electronically writable and readable memory, and supplies the generated signal to said memory; and
   a test signal control circuit unit that controls said data address signal generation circuit unit and said write/read signal generation circuit unit, based on a control signal received, and that selects, as a data signal and/or an address signal to be supplied to said memory, a data signal and/or an address signal from said data address signal generation circuit unit.

2. The semiconductor device according to claim 1, further comprising:
   a data signal switching circuit that selects, as a data signal to be supplied to said memory, one of a data signal from said data address signal generation circuit unit and a data signal via a user defined circuit; and
   an address signal switching circuit that selects, as an address signal given to said memory, one of an address signal from said data address signal generation circuit unit and an address signal via another user defined circuit;
   wherein said test signal control circuit unit respectively generates and outputs a signal that controls switching of said data signal switching circuit and a signal that controls switching of said address signal switching circuit, based on said control signal received.

3. The semiconductor device according to claim 1, further comprising a third scan flip-flop which holds data read from said memory, the read data captured by the third scan flip-flop being output from a scan output terminal to the outside of the semiconductor device by a scan-shift operation.

4. The semiconductor device according to claim 3, wherein said third scan flip-flop is included in said BIST.

5. The semiconductor device according to claim 1, wherein said data address signal generation circuit unit comprises a first selector circuit that receives a data signal from said BIST and a feedback signal of an output signal of said first scan flip-flop and selects and outputs one of the signals received, based on a selection control signal from said test signal control circuit unit, an output signal of said first selector circuit being supplied to an input terminal of said first scan flip-flop, wherein one of an output signal of said first scan flip-flop or a signal obtained by inverting an output signal of said first scan flip-flop is supplied, as said feedback signal, to said first selector circuit, based on a control signal from said test signal control circuit unit.

6. The semiconductor device according to claim 5, wherein said first selector circuit of said data address signal generation circuit unit receives an output from a fourth scan flip-flop as a data signal from said BIST.

7. The semiconductor device according to claim 1, wherein said data address signal generation circuit unit comprises a second selector circuit that receives an address signal from within said BIST and a feedback signal of an output signal of said second scan flip-flop and selects and outputs one of the signals received, based on a selection control signal from said test signal control circuit unit, an output signal of said second selector circuit being supplied to an input terminal of said second scan flip-flop, wherein one of an output signal of said second scan flip-flop or a signal obtained by inverting an output signal of said second scan flip-flop in said inverting circuit is supplied, as said feedback signal, to said second selector circuit, based on a control signal from said test signal control circuit unit.

8. The semiconductor device according to claim 7, wherein said second selector circuit of said data address signal generation circuit unit receives an output from a fifth scan flip-flop.

9. The semiconductor device according to claim 1, wherein said write/read signal generation circuit unit comprises a flip-flop which, responsive to a clock signal, captures and holds a value obtained by inverting a current signal value by an inverting circuit; and a selector circuit which selects one of output of said flip-flop and a write/read signal supplied thereto, based on a selection control signal from said test signal control circuit unit.

10. The semiconductor device according to claim 9, wherein said flip-flop provided in said write/read signal generation circuit unit comprises a scan flip-flop.

11. The semiconductor device according to claim 1, wherein said write/read signal generation circuit unit comprises a shift register that includes a plurality of flip-flops connected in cascade, the shift register receiving as an input a value obtained by inverting an output signal of said shift register by an inverting circuit, said device further comprising a selector circuit that selects one of an output signal of said shift register and a write/read signal supplied thereto, based on a selection control signal from said test signal control circuit unit.

12. A method for testing a semiconductor device including BIST (Built in Self Test) and an electronically writable and readable memory, said method comprising:
generating a data signal based on a value set in a first scan flip-flop provided in the BIST;
generating an address signal based on a value set in a second scan flip-flop provided in the BIST;
setting a signal that is for controlling writing to and reading from the electronically writable and readable memory, to a write mode, and providing said signal to said memory;
supplying data and address signals generated based on a value set in said first and second scan flip-flop to said memory;
setting a signal controlling writing to and reading from said memory, to a read mode, and capturing by a scan flip-flop data read from said memory; and
outputting read data captured by said scan flip-flop by a scan shift operation, to a scan-out terminal and comparing with an expected value.

13. The method according to claim 12, further comprising selecting data and address signals generated based on a value set in one of said first and second scan flip-flop or data and address signals via a user defined circuit and supplying the selected data and address signals.

14. The method according to claim 12, further comprising supplying to said memory a data signal or an address signal generated based on a value obtained by inverting a value set in one of said first and second scan flip-flop.

* * * * *